United States Patent
Zhang et al.

(10) Patent No.: US 10,254,337 B2
(45) Date of Patent: Apr. 9, 2019

(54) SYSTEM AND METHOD FOR ESTABLISHING A TRUSTED DIAGNOSIS/DEBUGGING AGENT OVER A CLOSED COMMODITY DEVICE

(71) Applicant: Marvell World Trade Ltd., St. Michael (BB)

(72) Inventors: Minda Zhang, Westford, MA (US); Marlon Moncrieffe, Leominster, MA (US); Cesare Ferri, Belmont, MA (US)

(73) Assignee: Marvell World Trade Ltd., St. Michael (BB)

( * ) Notice: Subject to any disclaimer, the term of this patent is extended or adjusted under 35 U.S.C. 154(b) by 142 days.

(21) Appl. No.: 15/334,027

(22) Filed: Oct. 25, 2016

(65) Prior Publication Data

US 2017/0115350 A1 Apr. 27, 2017

Related U.S. Application Data

(60) Provisional application No. 62/246,741, filed on Oct. 27, 2015.

(51) Int. Cl.
*G06F 11/00* (2006.01)
*G01R 31/317* (2006.01)
(Continued)

(52) U.S. Cl.
CPC ... *G01R 31/31705* (2013.01); *G01R 31/3177* (2013.01); *G01R 31/31719* (2013.01);
(Continued)

(58) Field of Classification Search
CPC ............. G06F 11/2028; G06F 11/3656; G01R 31/31705; G01R 31/31719; G01R 31/3177
See application file for complete search history.

(56) References Cited

U.S. PATENT DOCUMENTS 5,943,498 A * 8/1999 Yano ................... G06F 11/3656
714/E11.214
5,978,937 A * 11/1999 Miyamori ........... G06F 11/3656
714/45
(Continued)

FOREIGN PATENT DOCUMENTS

| EP | 1280061 A1 | 1/2003 |
| WO | WO2005076139 A1 | 8/2005 |
| WO | WO2008061089 A1 | 5/2008 |

OTHER PUBLICATIONS

International Application No. PCT/IB2016/056421, Notification of Transmittal of the International Search Report and the Written Opinion of the International Searching Authority, dated Jan. 17, 2017, 12 pages.

*Primary Examiner* — Joshua P Lottich (57) ABSTRACT

Systems, devices, and techniques relating to remote debugging are described. A described device includes a first processor core configured to provide an application execution environment, memory coupled with the first processor core; a second processor core configured to provide a secure execution environment; and a communication interface coupled with the first processor core and the second processor core, the communication interface being configured to communicate with external devices, the communication interface being shared at least between the application execution environment and the secure execution environment. The second processor core can be configured to monitor the application execution environment of the first processor core, determine whether to allow a debug session with an external device, via the communication interface, based on credentials received from the external device, and provide, via the debug session, read and write access to the memory and one or more registers of the first processor core.

20 Claims, 6 Drawing Sheets

(51) Int. Cl.
    *G01R 31/3177*    (2006.01)
    *G06F 11/20*    (2006.01)
    *G06F 11/36*    (2006.01)

(52) U.S. Cl.
    CPC ...... *G06F 11/2028* (2013.01); *G06F 11/3656* (2013.01); *G06F 2201/805* (2013.01)

(56) References Cited

U.S. PATENT DOCUMENTS

| | | | | |
|---|---|---|---|---|
| 6,446,221 | B1 * | 9/2002 | Jaggar | G06F 11/3648 714/30 |
| 6,665,816 | B1 * | 12/2003 | Edwards | G01R 31/318533 710/50 |
| 6,779,145 | B1 * | 8/2004 | Edwards | G06F 11/3636 324/73.1 |
| 7,080,258 | B2 * | 7/2006 | Kawasaki | G06F 11/3656 713/187 |
| 7,627,784 | B1 * | 12/2009 | Allen | G06F 11/3636 714/30 |
| 7,665,002 | B1 * | 2/2010 | White | G01R 31/31705 714/727 |
| 2001/0032305 | A1 * | 10/2001 | Barry | G06F 9/321 712/34 |
| 2008/0148343 | A1 | 6/2008 | Taniguchi | |
| 2010/0299467 | A1 * | 11/2010 | Yoon | G06F 11/362 710/105 |
| 2010/0318848 | A1 * | 12/2010 | Yang | G01R 31/31713 714/30 |
| 2012/0151264 | A1 * | 6/2012 | Balkan | G06F 11/3656 714/34 |
| 2013/0152050 | A1 | 6/2013 | Chang et al. | |
| 2013/0212425 | A1 * | 8/2013 | Blaine | G06F 11/3648 714/6.1 |
| 2013/0346026 | A1 * | 12/2013 | Teich | G06F 11/273 702/183 |

* cited by examiner

SYSTEM AND METHOD FOR ESTABLISHING A TRUSTED DIAGNOSIS/DEBUGGING AGENT OVER A CLOSED COMMODITY DEVICE

CROSS REFERENCE TO RELATED APPLICATIONS

This present disclosure claims the benefit of the priority of U.S. Provisional Application Ser. No. 62/246,741, filed Oct. 27, 2015, and entitled "SYSTEM AND METHOD FOR ESTABLISHING A TRUSTED DIAGNOSIS/DEBUGGING AGENT OVER A CLOSED COMMODITY DEVICE," which is incorporated herein by reference in its entirety.

BACKGROUND

This disclosure relates to remote debugging systems and techniques.

Applications and other software running on a device may stop functioning properly and may even cause the device to crash. Typically, debugging software is used to find the root cause of the problem, e.g., a defect in the application, a defect in the device's operating system (OS) kernel, or a combination of defects. Electronics within the device, such as integrated circuits, are often designed with built-in testing and debugging hardware to provide access to an external testing and debugging platform via a dedicated debug port.

To assist in hardware and software debugging, a consortium of companies formed the Joint Test Action Group (JTAG) to create an industry standard which would define an architecture and software protocol for built-in testing and debugging hardware. The resulting standard, sometimes referred to as JTAG, was adopted by the Institute of Electrical and Electronics Engineers (IEEE) as IEEE Standard 1149.1. The JTAG standard uses a boundary-scan architecture, so called because the JTAG circuitry is connected to a dedicated path around the integrated circuit's boundary (where the I/O pins are located). JTAG uses this boundary path to directly input to, and download data and instructions from, the I/O pins of the integrated circuit. The JTAG capability of an integrated circuit is accessed through a multi-pin JTAG test access port (TAP), through which instructions and data from external testing software are input and instructions and data from the integrated circuit are output.

The JTAG interface and circuitry can be used to implement debugging and emulation functions. In debugging embodiments, the JTAG interface is used to download code, execute it, and examine register and memory values. Further, the JTAG interface can enable debugging techniques such as code tracing, benchmarking, trapping, evaluating breakpoints, profiling, etc. Typically, a dedicated debug port such as a JTAG port is separate from a device's other wireline ports such as Universal Serial Bus (USB), Ethernet, etc., and is separate from a device's wireless ports such as Bluetooth, cellular, or Wi-Fi (e.g., IEEE 802.11).

SUMMARY

The present disclosure includes systems and techniques for remote debugging of devices. According to an aspect of the present disclosure, a debugging technique includes operating a first processor core of a target device to provide an application execution environment; monitoring, from a secure execution environment of a second processor core of the target device, the application execution environment of the first processor core; operating a communication interface of the target device to provide external communications for the application execution environment and the secure execution environment; detecting, within the secure execution environment of the second processor core of the device, an external device connecting to the device, via the communication interface, to start a debug session; determining whether to allow the debug session based on credentials received, via the communicate interface, from the external device; and providing, via the debug session, read and write access to one or more memories of the device and one or more registers of the first processor core based on the credentials being successfully authenticated.

This and other implementations can include one or more of the following features. Implementations can include detecting a crash event associated with the first processor core; and operating the second processor core to take over the communication interface based on a detection of the crash event to enable external connectivity for debugging purposes. Implementations can include detecting a crash event associated with the first processor core; and operating the second processor core to generate a crash report based on a detection of the crash event; and operating the second processor core to provide the crash report via the debug session. In some implementations, the communication interface comprises a wireless communication interface. Implementations can include providing the debug session over the wireless communication interface. In some implementations, the credentials include key information and a digital signature. Determining whether to allow the debug session can include authenticating the external device based on the key information and the digital signature. Determining whether to allow the debug session can include retrieving key information from a one-time-programmable memory coupled with the second processor core. Authenticating can include authenticating the external device based on a comparison of the key information of the one-time-programmable memory and the key information of the credentials.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example, one or more disclosed embodiments can be implemented in various systems and apparatus, including, but not limited to, a special purpose data processing apparatus (e.g., a wireless communication device such as a wireless access point, a remote environment monitor, a router, a switch, a computer system component, a medium access unit), a mobile data processing apparatus (e.g., a wireless client, a cellular telephone, a smart phone, a personal digital assistant (PDA), a mobile computer, a digital camera), a general purpose data processing apparatus such as a computer, or combinations of these.

According to another aspect of the present disclosure, a device can include a first processor core configured to provide an application execution environment, memory coupled with the first processor core; a second processor core configured to provide a secure execution environment; and a communication interface coupled with the first processor core and the second processor core, the communication interface being configured to communicate with external devices, the communication interface being shared at least between the application execution environment and the secure execution environment. The second processor core can be configured to monitor the application execution environment of the first processor core, determine whether to allow a debug session with an external device, via the communication interface, based on credentials received from the external device, and provide, via the debug session, read and write access to the memory and one or more registers of the first processor core.

This and other implementations can include one or more of the following features. In some implementations, the second processor core is configured to detect a crash event associated with the first processor core. In some implementations, the second processor core is configured to take over the communication interface based on a detection of the crash event to enable external connectivity for debugging purposes. In some implementations, the second processor core is configured to detect a crash event associated with the first processor core, generate a crash report based on a detection of the crash event, and provide the crash report via the debug session. In some implementations, the communication interface includes a wireless communication interface, and the second processor core is configured to provide the debug session over the wireless communication interface. In some implementations, the credentials include key information and a digital signature, and the second processor core is configured to authenticate the external device based on the key information and the digital signature. Implementations can include a one-time-programmable memory coupled with the second processor core, where the one-time-programmable memory is provisioned with key information. The second processor core can be configured to authenticate the external device based on a comparison of the key information of the one-time-programmable memory and the key information of the credentials. In some implementations, the device includes a system-on-chip (SoC), and the second processor core is configured to provide, via the debug session, access to one or more SoC registers and one or more SoC peripherals.

According to yet another aspect of the present disclosure, a system includes a target device and an external device. The target device can include a first processor core configured to provide an application execution environment, memory coupled with the first processor core, a second processor core configured to provide a secure execution environment, and a communication interface coupled with the first processor core and the second processor core, the communication interface being configured to communicate with external devices, and provide a communication service for the communication interface being shared at least between the application execution environment and the secure execution environment. The external device can be configured to debug the target device. The external device can be configured to connect to the target device via the communication interface to start a debug session and provide credentials to the target device for the target device to authenticate the external device before allowing the debug session. The second processor core of the target device can be configured to monitor the application execution environment of the first processor core. The second processor core can be configured to determine whether to allow the debug session with the external device via the communication interface if the credentials are successfully authenticated, and provide, via the debug session, read and write access to the memory and one or more registers of the first processor core.

Particular configurations of the technology described in this disclosure can be implemented so as to realize one or more of the following potential advantages. A described technology provides an authenticated invasive all-access full-featured debugging experience without opening a closed commodity device such as a smartphone, set-top-box (STB), printer, router, etc. Typically, device manufacturers minimize cost by not exposing internal debug ports, thereby making it difficult for traditional debugging techniques. Moreover, some devices are sealed in a fashion that inhibits access to internal debug ports, if such ports even exist. A described technology provides invasive debugging capabilities without opening or physically modifying a closed commodity device. A described technology provides a technique for detecting and reporting system crashes caused by System-on-Chip (SoC) hardware failure, Basic Input/Output System (BIOS) failure, firmware failure, or an Operating System (OS) hang. A described technology provides a technique for selective data recovery, where a trusted diagnostic module can be dynamically configured to capture and store data from user-defined memory regions in the event of a crash. A described technology provides a technique for an external debug agent to communicate with a device over a set of one or more specified standard communication ports such as USB, Bluetooth, or Wi-Fi, rather than over a dedicated debug port such as JTAG. A described technology provides secure post-production debugging capabilities without requiring a dedicated external debug port, which can minimize device costs and improve a device's overall appearance.

Details of one or more implementations are set forth in the accompanying drawings and the description below. Other features and advantages may be apparent from the description and drawings, and from the claims.

DRAWING DESCRIPTIONS

Like reference symbols in the various drawings indicate like elements.

DETAILED DESCRIPTION

Closed commodity devices such as mobile phones, set-top boxes, and Internet-of-Thing (IoT) devices may require repairs or maintenance that are possibly associated with a hardware or software defect. Typically, some analysis of the device is required to identify and categorize the source of the failure and determine any possible steps for repairs. The challenge for this kind of analysis is that by design, closed commodity devices do not provide a straightforward mechanism for accessing the state of the hardware or software it houses —making it difficult to assess the source of failure without physically opening the device. A modern smartphone, for example, is physically sealed to prevent access to internal components such as an internal debug port. Moreover, to reduce costs, a manufacturer may not include an internal debug port.

This disclosure describes techniques and systems that provide a remote debug mechanism for accessing the hardware and software of a closed commodity device without opening the device, and doing so within a secure and trusted environment that can only be established by an authorized user. The remote debug mechanism includes a Trusted Diagnostic Module (TDM) within the closed commodity device. The TDM includes hardware and software components. The TDM operates within a secure execution environment on the device separate from the device's application processor (AP) domain. Further, the TDM authenticates external devices before allowing debug access to the device from an external debug host. The remote debug mechanism can include one or more of the following: a crash detection module residing on the device, a communication interface such as USB, Bluetooth, or Wi-Fi on the device for providing communication between the device and external devices such as the external debug host, and a middleware layer on the external debug host that handles a debug communication protocol between the device and the host's external debug agent.

Figure 1:
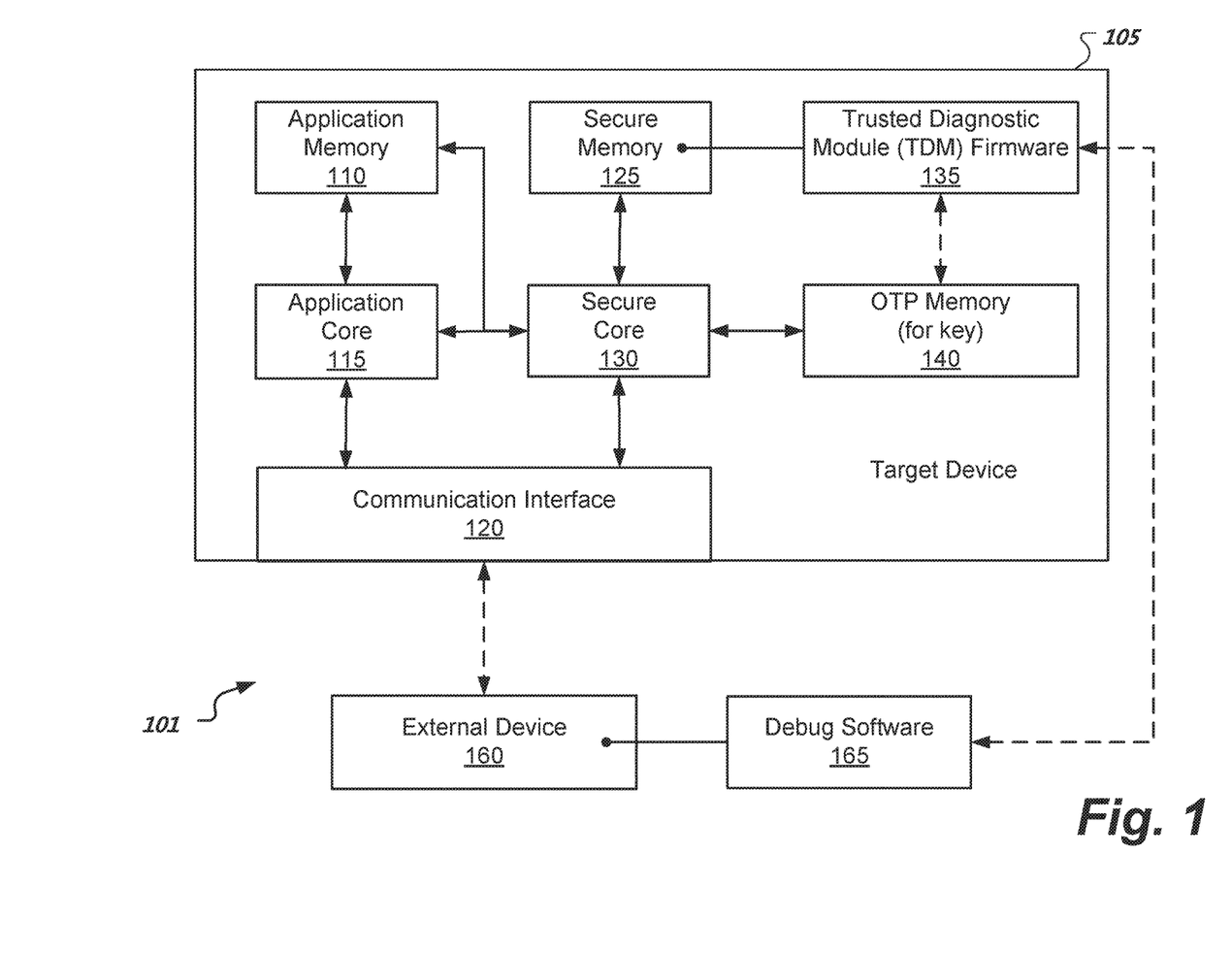
FIG. 1 shows an architecture of an example of a debug system that includes a target device and an external device.

FIG. 1 shows an architecture of an example of a debug system 101 that includes a target device 105 and an external device 160. In this example, the target device 105, e.g., a closed commodity device, is the subject of debugging by debug software 165 running on the external device 160. The external device 160 is so-named because it is "external" to the target device 105. The target device 105 includes an application core 115, application memory 110, secure core 130, secure memory 125, one-time-programmable (OTP) memory 140, and a communication interface 120. In some implementations, the target device 105 includes a SoC that contains one or more of the depicted components, where the SoC includes additional components such as SoC registers and SoC peripherals.

The application core 115 is configured to provide an application execution environment. The application memory 110 stores programs and data for the application execution environment. In some implementations, the core 115 include one or more processors and one or more registers. In some implementations, the target device 105 includes two or more application cores. The application core 115 communicates with external devices via the communication interface 120. In some implementations, the communication interface 120 includes physical (PHY) layer circuitry, and the application core 115 is configured to execute firmware that implements a communication stack, e.g., medium access control (MAC) layer, for the PHY layer circuitry. In some implementations, the communication interface 120 includes PHY layer circuitry and a MAC controller.

The secure core 130 can be configured to provide a secure execution environment. For example, the secure core 130 can execute Trusted Diagnostic Module (TDM) firmware 135 stored in secure memory 125. The secure memory 125 is so-named because it is accessible by the secure core 130. Generally, the application core 115 lacks access to the secure memory 125. Executing the TDM firmware 135, the secure core 130 can access various device components such as the application core 115 and application memory 110 to provide remote debugging capabilities via the communication interface 120. In some implementations, remote debugging capabilities include accessing a crash report, reading memory data, writing memory data, reading processor core register data, writing processor core register data, and diagnostics. In some implementations, remote debugging capabilities include removing or installing applications, OS files, images, firmware, or drivers.

Debug software 165 on the external device 160 can establish a debug session with the TDM firmware 135. In this example, TDM firmware 135 is configured to authenticate the external device 160 before allowing full debug access to the device 105. A device manufacturer can store key information in the OTP memory 140 during a manufacturing process. The device manufacturer can selectively distribute the key information to allow devices such as the external device 160 to access the debugging capabilities of the target device 105. The debug software 165 on the external device 160 can use the manufacturer's distributed key information to generate and send a credentials message to the target device 105. The TDM firmware 135 can determine whether key information included in the credentials message corresponds with the key information in the OTP memory 140. In some implementations, the authentication credentials message includes a digital signature based on the distributed key information, and the TDM firmware 135 verifies that the digital signature is authentic. In some implementations, the OTP memory 140 is provisioned with key information such as a hash digest of a public key associated with the device, and the secure core 130 is configured to authenticate the external device 160 based on a comparison of the hash digest stored in the OTP memory 140 and key information within a credentials message received from the external device 160.

Figure 2:
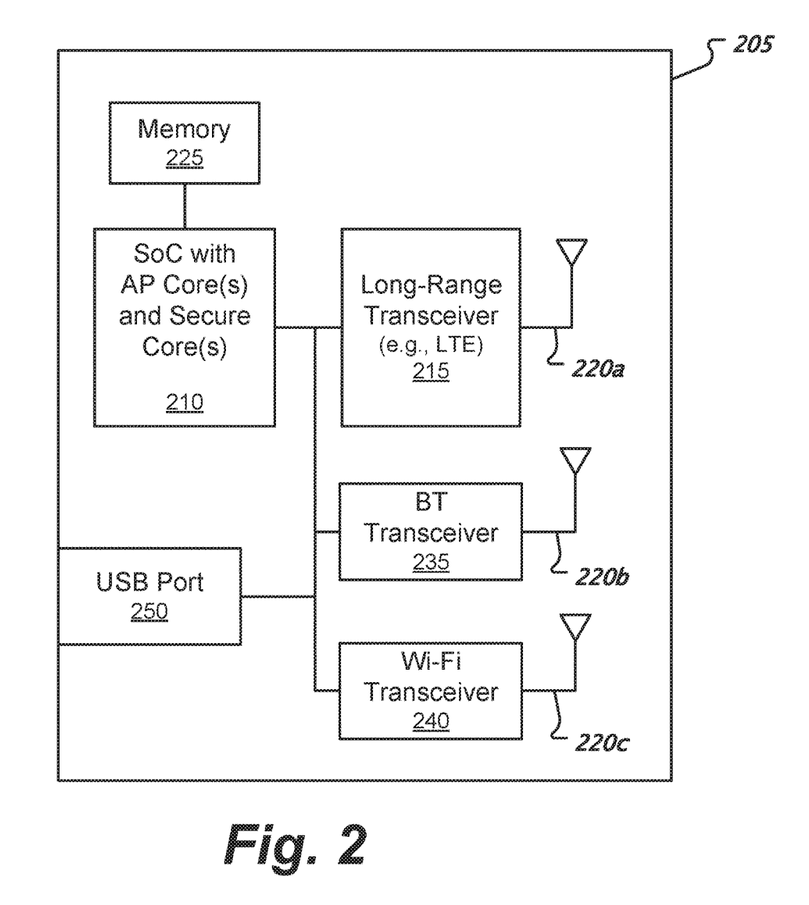
FIG. 2 shows a block diagram of an example of a wireless communication device that provides a remote debugging capability over a shared communication interface.

FIG. 2 shows a block diagram of an example of a wireless communication device 205 that provides a remote debugging capability over a shared communication interface. The device 205 includes a SoC 210. The SoC 210 includes one or more application processor cores and one or more secure processor cores. The SoC 210 is coupled with communication interfaces such as USB port 250, a long-range transceiver 215, a Bluetooth transceiver 235, and a Wi-Fi transceiver 240. Other types of communication interfaces are possible such as a combined communication bus and power connector port. In some implementations, the long-range transceiver 215 includes a Long Term Evolution (LTE) modem. The long-range transceiver 215, a Bluetooth transceiver 235, and a Wi-Fi transceiver 240 are coupled with respective antennas 220a, 220b, and 220c. While the antennas 220a, 220b, and 220c are depicted as internally contained within the device 205, other antenna configurations are also possible. For example, the transceivers 215, 235, and 240 can share one or more antennas 220a-c. The USB port 250 is externally exposed to provide connectivity with an external device via a USB cable. In some implementations, the SoC 210 includes one or more communication interfaces such as the USB port 250, the long-range transceiver 215, the Bluetooth transceiver 235, and the Wi-Fi transceiver 240.

The SoC 210 is coupled with a memory 225 configured to store information such as data and/or instructions. In some implementations, the SoC 210 includes the memory 225. In some implementations, the memory 225 includes a first memory for one or more application processor cores that stores application software and application related data and a second memory for one or more secure processor cores that stores trusted debug firmware that provides a remote debugging capability. In some implementations, communication interfaces such as the USB port 250, the long-range transceiver 215, the Bluetooth transceiver 235, the Wi-Fi transceiver 240, or a combination thereof are considered a shared communication interface in that they are shared between one or more application processor cores and one secure processor cores within the SoC 210. In some implementations, application communication traffic and debug communication traffic co-exist on a same communication interface such as the USB port 250, the long-range transceiver 215, the Bluetooth transceiver 235, or the Wi-Fi transceiver 240. In some implementations, the device 205 lacks a dedicated external debug port, such as a JTAG port that is externally exposed, for debugging operations associated with the SoC 210.

Figure 3:
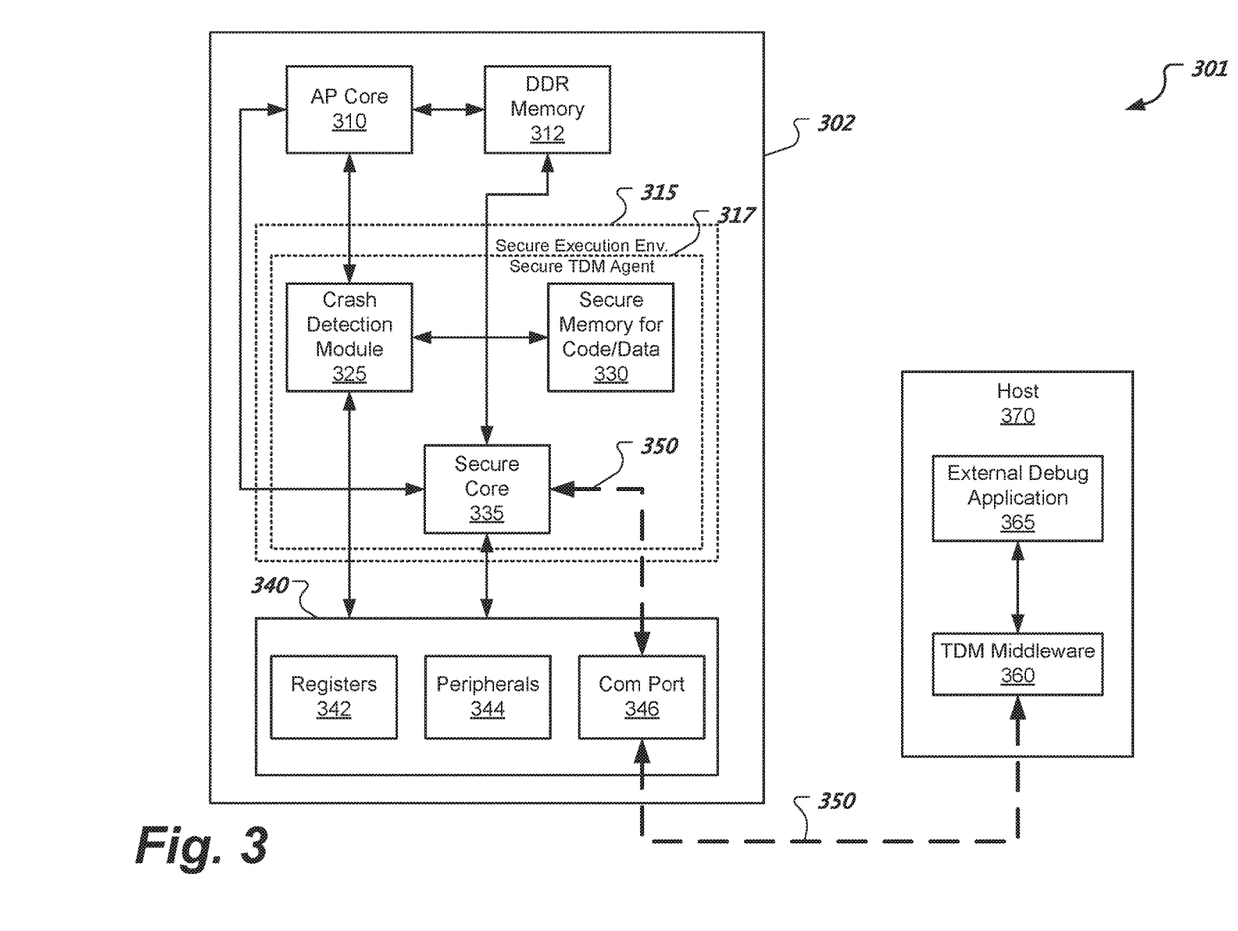
FIG. 3 shows an architecture of an example of a debug system that includes a target device and an external debug host.

FIG. 3 shows an architecture of an example of a debug system 301 that includes a target device 302 and an external debug host 370. The target device 302 includes an application processor (AP) core 310, main memory such as double data rate (DDR) memory 312, crash detection module 325, secure memory 330, secure core 335, and shared SoC components 340. The shared SoC components 340 include registers 342, peripherals 344, and communication port 346. The secure core 335 provides a secure execution environment 315 for a secure TDM agent 317. The external debug host 370 includes an external debug application 365 and TDM middleware 360 for communicating with the secure TDM agent 317. In some implementations, the external debug host 370 is a personal computer (PC).

The device 302 provides an application execution environment, sometimes referred to as an application processor domain, via AP core 310 to execute an OS and applications. Further, the device 302 provides a secure execution environment 315 that is separate from the AP domain. The secure execution environment 315 includes the secure core 335 and the secure memory 330. The secure memory 330 includes code and data such as firmware for the secure TDM agent 317. In some implementations, the secure core 335 includes a microcontroller. In some implementations, the secure memory 330 includes an OTP memory.

The device 302 includes a communication interface such as a communication port 346 for providing communication between the device 302 and an external device such as host 370. In some implementations, the communication port 346 includes a USB port. In some implementations, the communication port 346 includes a wireless interface such as Bluetooth or IEEE 802.11 based Wi-Fi. As depicted, device components including the AP core 310 and secure core 335 share the communication port 346.

The debug application 365 on the external debug host 370 establishes a debug session over a logical connection 350 with the secure core 335 via the communication port 346 of the target device 302. In some implementations, the logical connection 350 includes a Transmission Control Protocol (TCP) over Internet Protocol (IP) connection. In some implementations, the logical connection 350 includes a connection formed using a connectionless protocol such as User Datagram Protocol (UDP). In some implementations, a debug communication protocol is established on top of a base communication protocol for the exchange of debug commands and data between the external debug application 365 and the TDM agent 317 on the device 302. TDM middleware 360 on the host 370 handles the debug communication protocol, base communication protocol, or both between the device 302 and the external debug application 365. In some implementations, a TDM library such as a dynamic-link library (DLL) resides on the host 370 that includes routines for transporting commands and data back and forth between the external debug application 365 and the TDM agent 317 on the device 302.

The secure TDM agent 317 is configured to authenticate devices such as the host 370 before allowing full debug access. In this example, the secure TDM agent 317 executing in the secure execution environment 315 serves as a secure agent that provides authorized access to the device's components such as DDR memory 312, runtime state for the AP core 310, registers of the AP core 310, SoC registers 342, and SoC peripherals 344, to the external debug host 370. In some implementations, the secure TDM agent 317 requires the device 302 to be provisioned with a hash digest of a device public key of the device manufacturer's choice during a manufacturing process. In some implementations, the external debug application 365 requires key information from the manufacturer of the device 302 to generate a digitally signed message that can be verified by the TDM agent 317 on the device 302 for granting debugging access to the device 302. In this way, the device manufacturer can control access to the device 302. Once authorized, the debug application 365 has full read and write access to device components such as SoC registers 342, SoC peripherals 344, DDR memory 312, and one or more AP cores 310 through the TDM agent 317.

The device 302 includes a crash detection module 325. The crash detection module 325 can include a hardware sensor or a combination of hardware and software that detects when a crash of the AP core 310 has occurred, and triggers an action within the TDM agent 317 based on the current mode. In some implementations, the crash detection module 325 triggers the TDM agent 317 to take over the device's communication port 346 and make the port 346 available to the external debug application 365 for debugging purposes. In some implementations, the crash detection module 325 triggers the TDM agent 317 to capture and store user-defined data for recovery later after a self-initiated soft reset of the device 302.

Figure 4:
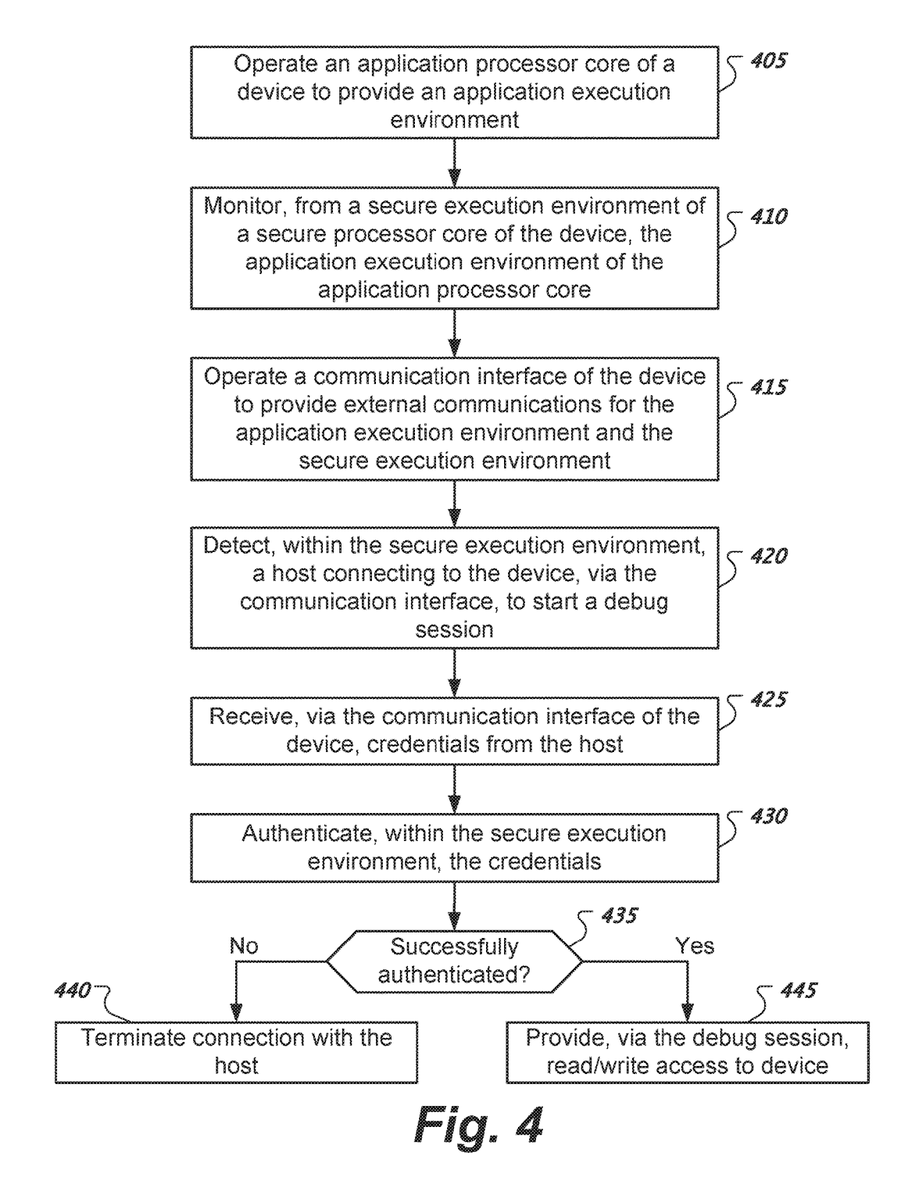
FIG. 4 shows a flowchart of an example of a debug related process of a target device.

FIG. 4 shows a flowchart of an example of a debug related process of a target device. Various examples of a target device include target device 105 of FIG. 1, device 205 of FIG. 2, and device 302 of FIG. 2. Other target devices are possible. At 405, the process operates an application processor core of a device to provide an application execution environment. In some implementations, the application processor core is configured to execute an OS that provides an application execution environment in which one or more applications are able to run. Various examples of applications include user-facing applications such as web browsers, music players, games and background applications such as communication daemons, device drivers, and OS management routines. At 410, the process monitors, from a secure execution environment of a secure processor core of the device, the application execution environment of the application processor core. In some implementations, the application execution environment includes an application that periodically communicates with the secure execution environment. In some implementations, monitoring the application execution environment includes receiving such periodic communications, checking one or more processor core state registers, or both.

At 415, the process operates a communication interface of the device to provide external communications for the application execution environment and the secure execution environment. In some implementations, operating a communication interface includes controlling PHY circuitry within the interface. In some implementations, the communication interface is shared between the application execution environment and the secure execution environment. In some implementations, a TDM agent within the secure execution environment takes over the communication interface based on detecting a crash within the application execution environment.

At 420, the process detects, within the secure execution environment, a host connecting to the device, via the communication interface, to start a debug session. In some implementations, detecting a host connection includes listening for an incoming packet on a predetermined logical port (e.g., corresponding to a destination port field within a TCP or UDP packet) that is reserved for debug sessions. At 425, the process receives, via the communication interface of the device, credentials from the host. For example, after connection establishment (e.g., after performing a TCP 3-way handshake or after forming a connection over a connectionless protocol such as UDP) the process receives credentials via one or more TCP or UDP packets. At 430, the process authenticates, within the secure execution environment, the credentials. In some implementations, authenticating the credentials includes accessing key information from a secure memory and determining whether a digital signature of the credentials matches what a digital signature should be based on the accessed key information. Various digital signatures algorithms exist such as RSA (the initials of its creators: Rivest, Shamir, and Adleman) based signature schemes, Digital Signature Algorithm (DSA), and Elliptic Curve Digital Signature Algorithm (ECDSA). However, any suitable digital signature algorithm can be used.

At 435, the process determines whether the credentials are successfully authenticated. If the credentials are not successfully authenticated, then at 440, the process terminates the connection with the host. In some implementations, terminating the connection with the host includes closing a TCP connection. In some implementations, terminating the connection with the host includes removing network information about the host that is used to facilitate communications with the host. In some implementations, terminating the connection with the host includes resetting a debug session connection state. If the credentials are successfully authenticated, then at 445, the process provides, via the debug session, read and write access to the device. In some implementations, the process provides read and write access to one or more memories of the device, one or more processor core registers, one or more processor core status registers, one or more SoC registers, one or more SoC peripherals, or a combination thereof.

Figure 5:
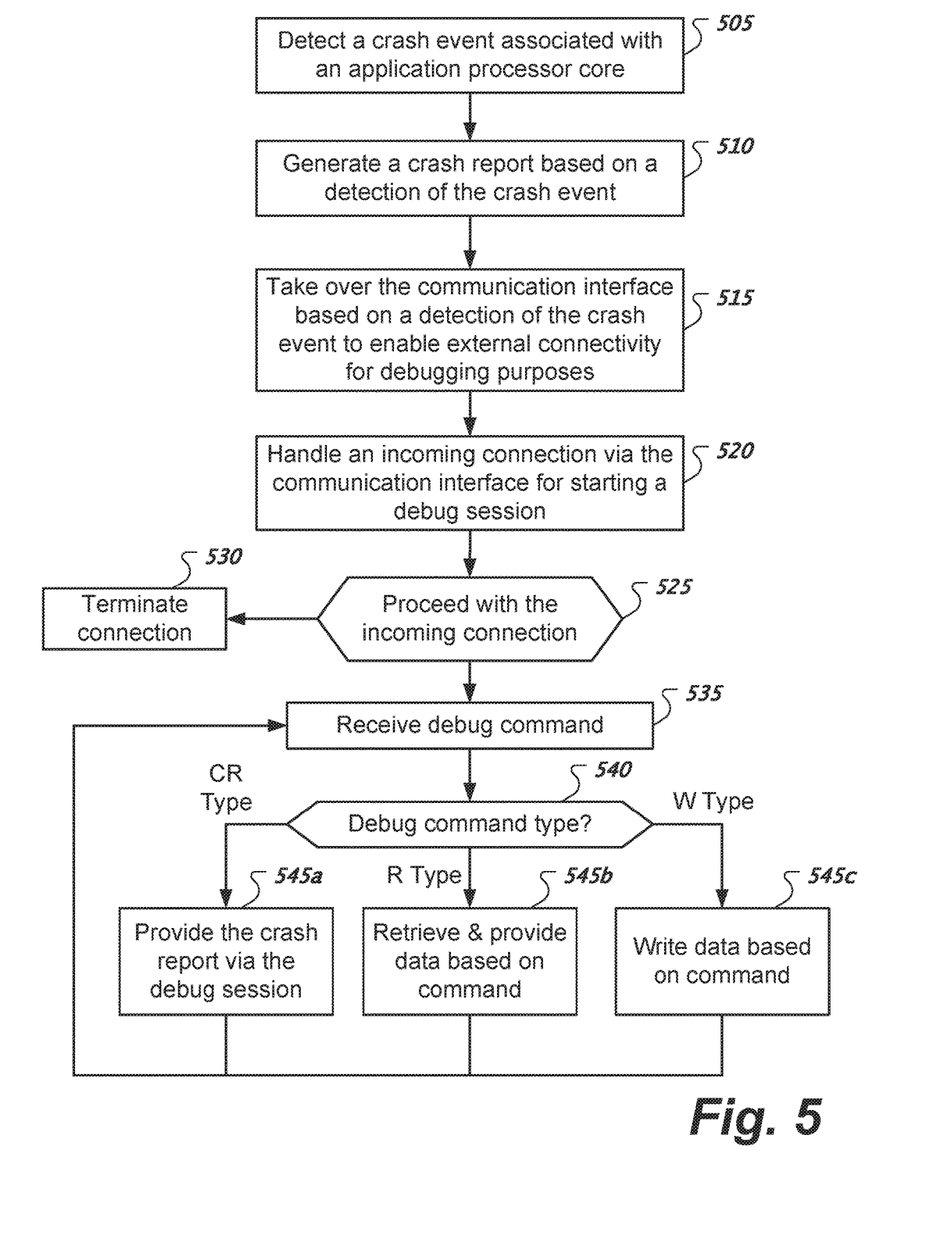
FIG. 5 shows a flowchart of another example of a debug related process of a target device.

FIG. 5 shows a flowchart of another example of a debug related process of a target device. At 505, the process detects a crash event associated with an application processor core. In some implementations, detecting a crash event includes detecting a lack of communication from an application processor core for a predetermined amount of time. In some implementations, detecting a crash event includes handling a watchdog timer expiration. At 510, the process generates a crash report based on a detection of the crash event. In some implementations, the crash report includes a dump of one or more processor core registers and processor core state registers. In some implementations, the crash report includes information about processes running on a processor core, call stack, or general operating system information. At 515, the process takes over the communication interface based on a detection of the crash event to enable external connectivity for debugging purposes. In some implementations, taking over the communication interface includes resetting the communication interface and controlling the communication interface from a secure processor core. In some implementations, taking over the communication interface includes activating a communication protocol stack to control the communication interface. In some implementations, the process launches a communication daemon process that opens a port to handle incoming connections that are received via the communication interface.

At 520, the process handles an incoming connection via the communication interface for starting a debug session. Handling the incoming connection can include authenticating the incoming connection. At 525, the process determines whether to proceed with the incoming connection. Determining whether to proceed with the incoming connection can include accessing an authentication status associated with the incoming connection. If the process decides not to proceed with the incoming connection, then at 530, the process terminates the connection. If the process decides to proceed with the incoming connection (e.g., authentication successful), then at 535, the process receives a debug command via the debug session. At 540, the process determines a command type associated with the debug command.

At 545*a-c*, the process handles the debug command. For example, if the debug command is a crash report (CR) request type, then at 545*a*, the process provides the crash report via the debug session. If the debug command is a read (R) request type, then at 545*b*, the process retrieves data from a memory in the device such as main memory, register memory, status memory, and sends the retrieved data via the debug session. If the debug command is a write (W) request type, then at 545*c*, the process writes data to a memory in the device such as main memory, register memory, status memory based on the command. If required, the process can send a write confirmation based on a successful completion of the write. While three types are depicted, other and or different debug command types are possible. After handling the debug command, the process can return to 535 to handle another debug command. In some implementations, a debug session can allow commands to reset the device, change core register settings, or change one or more IP module controller register settings, and re-activate the device to explore what-if situations as part of a root cause analysis procedure.

Figure 6:
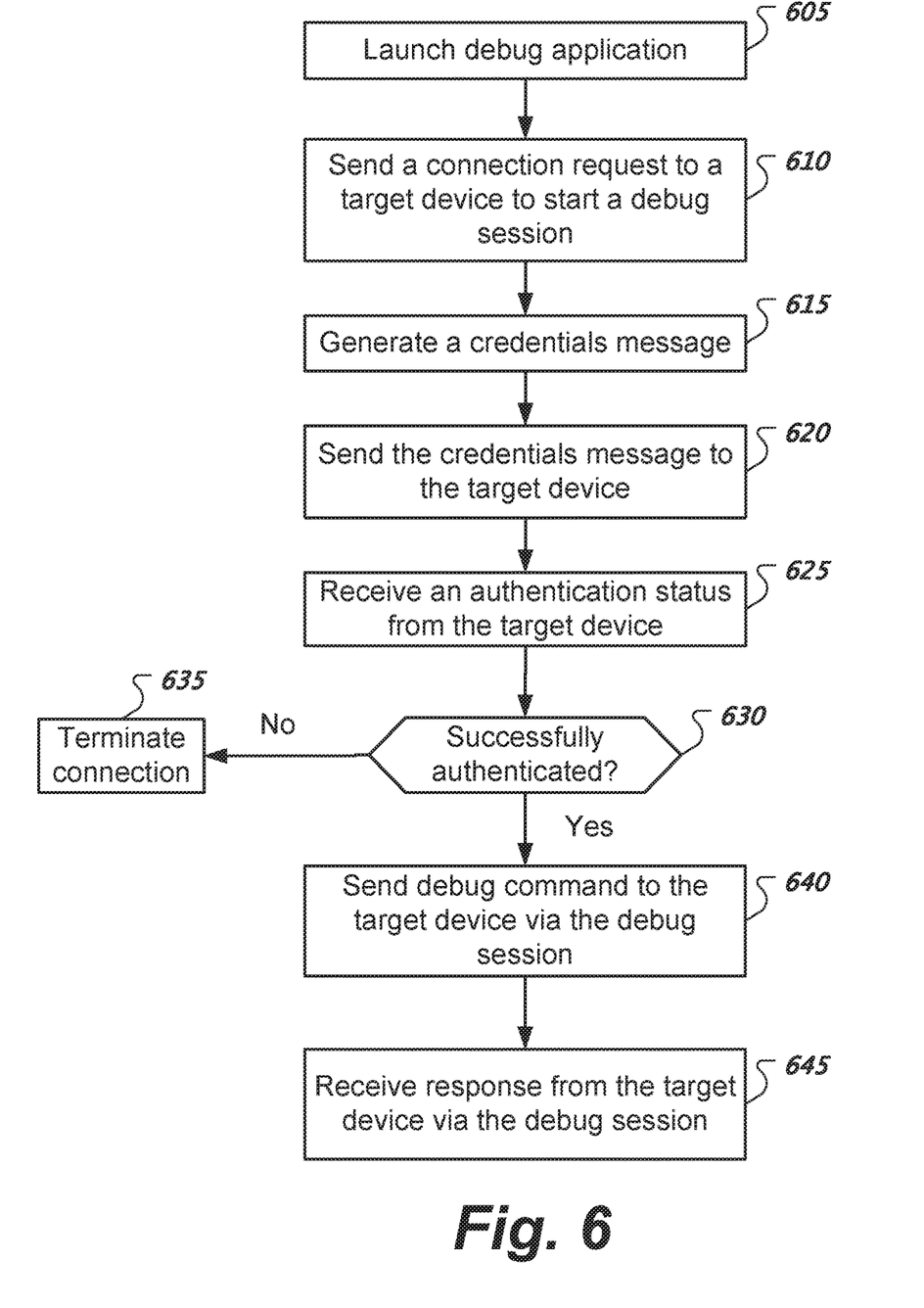
FIG. 6 shows a flowchart of an example of a debug related process of a host device.

FIG. 6 shows a flowchart of an example of a debug related process of a host device. Various examples of a host device include external device 160 of FIG. 1 and host 370 of FIG. 3. Other host devices are possible. At 605, the process launches a debug application. In some implementations, a debug application includes a user interface such as a graphical user interface (GUI) or a command-line interface (CLI) that is configured to provide user interactivity for remotely debugging a target device. At 610, the process sends a connection request to a target device to start a debug session. In some implementations, sending a connection request includes sending a TCP packet. In some implementations, sending a connection request includes sending a UDP packet. At 615, the process generates a credentials message. In some implementations, a credentials message includes a hash digest of a public key that is associated with the target device, and further includes a digital signature that covers the hash digest. At 620, the process sends the credentials package to the target device. At 625, the process receives an authentication status from the target device. At 630, the process determines whether the authentication status indicates a success. If not successful, then the process, at 635, terminates the connection. If successful, then the process, at

640, sends a debug command to the target device via the debug session. In some implementations, at 645, the process receives a response from the target device via the debug session.

A TDM agent, in general, can run on a secure processor (SP) core. The TDM agent can have complete access to and full view of a device's SoC. The SP core can provide a secure execution environment which is separate from the AP core domain. Thus, when an AP core crashes, the SP core is typically still alive, and can serve as an on-device-master for data capture, debug, or both. To this end, TDM firmware can provide one or more of the following services: crash detection, crash handling, crash reporting, live debugging, and user authorization. These services can be partitioned across different operation modes including an analysis mode and a debug mode.

Crash detection can include identifying when a failure has occurred within the AP domain, e.g., detecting one or more AP cores that are no longer able to execute normally. In some implementations, a TDM crash detection module uses a watchdog style approach to detect an AP core crash. For example, an AP core can kick the TDM periodically, e.g., send an alive message to the TDM every 50 milliseconds, where each kick extends a watchdog timer within the TDM. In the event that the watchdog timer expires, the TDM assumes that a crash has occurred. Note that watchdog style crash detection can require support from the AP core's operating system.

Crash handling can include performing one or more actions after a crash. Such actions can include extracting core state, register, and memory data. Other actions can include preparing the device for connection with an external debug host. The actions that take place after a crash can depend on a configured TDM mode, e.g., analysis mode or debug mode.

In analysis mode, the on-device TDM agent can place an AP core in a debug mode and extract critical register and status data from the AP core. In some implementations, the on-device TDM agent places an AP core in debug mode via a processor's debug mechanism. The TDM agent can capture crash information such as AP core register, status information, and SoC register data. The TDM agent can store the crash information in a secure memory that survives a soft reset. Once the crash information is captured and stored, the TDM agent can initiate a soft reset of the device, and subsequently report the crash status, the captured crash information, or both upon request from an external host.

In debug mode, an on-device TDM agent can stop one or more AP cores that have been taken out of reset, and take over and initialize a shared communication port to provide debugging connectivity with an external debug host. The TDM agent can wait for a connection with an external debug host via the communication port for live debugging. In this debug mode, an authorization process is used in authenticate an external debug host before granting debug access to the device.

Crash reporting can include assembling and formatting crash information including crash status. In some implementations, a client on a target device's AP core can use one or more application program interfaces (APIs) to query a crash status from the device's TDM agent, and request that any captured crash information be dumped out to a user-defined location. In some implementations, a TDM agent defines the status codes and the data dump format, which are shared with the querying client beforehand.

Live debugging can include using an external debug host to conduct intrusive accesses to a target device, such as actively probing the device's SoC registers and other device memory regions. In some implementations, the TDM agent allows the external debug host to set or reset one or more AP core registers. In some implementations, the TDM agent allows the external debug host to activate the device's AP core to run under certain conditions.

TDM's live debugging can include using a physical communication channel with the host (e.g., USB, Bluetooth, or Wi-Fi) and a software communication protocol with the TDM middleware, e.g., a TDM DLL, running on the host. To instantiate a debug session, host debug software can invoke a high-level API defined in the TDM middleware. The TDM middleware takes the burden of encoding high-level debug commands, received from the host debug software, into low-level protocol messages in accordance with a debug communication protocol. The TDM middleware sends the low-level protocol messages through the communication channel to the TDM agent on the device. Because of the intrusive nature of live debugging, live debugging can be safeguarded via an authorization process, which grants the external debug host access to the device only if the host is authorized.

When supported by the target device's operating system, TDM can provide live debugging at boot-time or after the OS has booted and crashed. For boot-time live debugging, an authorization process that occurs very early in the boot process triggers a TDM to become a master of a device's shared communication port and stop one or more AP cores that have been taken out of reset. At that time, the TDM can await a connection from an external debug agent via the shared communication port. For crash-time live debug, when a crash has been detected and TDM is in a debug mode, the TDM can initialize the device's shared communication port and stop one or more AP cores that are running. At that time, the TDM can await a connection from an external debug host via the shared communication port.

A TDM agent can perform user authorization before granting access to one or more of its debugging services. In some implementations, a user authorization process includes receiving, at a TDM agent, one or more messages containing an authorization package, which has been digitally signed with the device manufacturer's signing key, from an external debug host. Note that the target device can be provisioned with a hash digest of the manufacturer's public key during device assembly. Next, the authentication process can check whether the hash digest of the public key provisioned in the target device matches with the one stored in the authentication package. Such checking can guarantee that the package's signature was indeed generated with the manufacturer's signing key. The process then continues by verifying the digital signature of the authentication package. If the signature is successfully verified, then the device has been authorized, and access is granted to the external debug host software. This process ensures that only users with the appropriate credentials can access the device for invasive debugging and analysis.

In the case where the shared communication port is USB, the following scenario illustrates an TDM usage example. A closed commodity device that has been functioning normally experiences an unknown failure. Internally, the TDM firmware detects the crash, handles the crash by stopping all running AP cores, initializes the USB port, places the device in a debug mode, and waits for a connection from an external debug host. Next, the device which has not been powered off is brought in to a service center to be diagnosed by an authorized field engineer. The engineer connects the device to a host PC with a USB cable. The device enumerates and is recognized by the host PC. The engineer launches a hardware debugger application on the host PC. The application uses the host's TDM middleware to establish communications with the device via the USB using a debug communication protocol. The TDM middleware transmits the engineer's credentials. The credentials can include a key and a digital signature. The TDM firmware on the device authenticates the credentials, and allows access to the device if successfully authenticated. After authentication, the hardware debugger application is able to send debug commands such as read and write commands to the device via the TDM middleware, having a full view of the device's SoC. The engineer is able to diagnose and root-cause the issue using the hardware debugger application.

In some implementations, a target device can include a first processor core configured to provide an application execution environment, memory coupled with the first processor core; a second processor core configured to provide a secure execution environment; and a communication interface coupled with the first processor core and the second processor core, the communication interface being configured to communicate with external devices and provide a communication service for the application execution environment and the secure execution environment. In some implementations, the second processor core is configured to monitor the application execution environment of the first processor core, detect an external device connecting to the device, via the communication interface, to start a debug session, receive credentials from the external device, allow the debug session if the credentials are successfully authenticated, and provide, via the debug session, read and write access to the memory and one or more registers of the first processor core.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

What is claimed is:

1. A device comprising:
   a first processor core configured to provide and execute an application execution environment,
   first memory coupled with the first processor core, wherein the first memory is an application memory configured to store programs and data for the application execution environment;
   a second processor core, separate from the first processor core, configured to provide and execute a secure execution environment;
   second memory, separate from the first memory, coupled with the second processor core, wherein the second memory is a secure memory configured to store firmware for executing the secure execution environment; and
   a communication interface coupled with the first processor core and the second processor core, the communication interface being configured to communicate with external devices, the communication interface being shared at least between the application execution environment and the secure execution environment,
   wherein the second processor core is configured to execute the firmware stored in the second memory to:
      monitor the application execution environment of the first processor core,
      determine whether to allow a debug session with an external device, via the communication interface, based on credentials received from the external device, and
      provide, via the debug session, read and write access to the first memory and one or more registers of the first processor core.

2. The device of claim 1, wherein the second processor core is configured to detect a crash event associated with the first processor core, and wherein the second processor core is configured to take over the communication interface based on a detection of the crash event to enable external connectivity for debugging purposes.

3. The device of claim 1, wherein the second processor core is configured to detect a crash event associated with the first processor core, generate a crash report based on a detection of the crash event, and provide the crash report via the debug session.

4. The device of claim 1, wherein the communication interface comprises a wireless communication interface, and wherein the second processor core is configured to provide the debug session over the wireless communication interface.

5. The device of claim 1, wherein the credentials comprise key information and a digital signature, and wherein the second processor core is configured to authenticate the external device based on the key information and the digital signature.

6. The device of claim 5, comprising:
one-time-programmable memory coupled with the second processor core, wherein the one-time-programmable memory is provisioned with key information, and wherein the second processor core is configured to authenticate the external device based on a comparison of i) the key information of the one-time-programmable memory and ii) the key information of the credentials.

7. The device of claim 1, wherein the device comprises a system-on-chip (SoC), and wherein the second processor core is configured to provide, via the debug session, access to one or more SoC registers and one or more SoC peripherals.

8. A system comprising:
a target device comprising i) a first processor core configured to provide an application execution environment, ii) first memory coupled with the first processor core, wherein the first memory is an application memory that stores programs and data for the application execution environment iii) a second processor core, separate from the first processor core, configured to provide a secure execution environment, iv) second memory, separate from the first memory, coupled with the second processor core, wherein the second memory is secure memory that stores firmware for executing the secure execution environment, and v) a communication interface coupled with the first processor core and the second processor core, the communication interface being configured to communicate with external devices, and provide a communication service for the communication interface being shared at least between the application execution environment and the secure execution environment; and
an external device configured to debug the target device, wherein the external device is configured to connect to the target device via the communication interface to start a debug session and provide credentials to the target device for the target device to authenticate the external device before allowing the debug session, and
wherein the second processor core is configured to execute the firmware stored in the second memory to monitor the application execution environment of the first processor core, wherein the second processor core is configured to determine whether to allow the debug session with the external device via the communication interface if the credentials are successfully authenticated, and provide, via the debug session, read and write access to the first memory and one or more registers of the first processor core.

9. The system of claim 8, wherein the second processor core is configured to detect a crash event associated with the first processor core, and to take over the communication interface based on a detection of the crash event to enable external connectivity for debugging purposes.

10. The system of claim 8, wherein the second processor core is configured to detect a crash event associated with the first processor core, generate a crash report based on a detection of the crash event, and provide the crash report via the debug session.

11. The system of claim 8, wherein the communication interface comprises a wireless communication interface, and wherein the second processor core is configured to provide the debug session over the wireless communication interface.

12. The system of claim 8, wherein the credentials comprise key information and a digital signature, and wherein the second processor core is configured to authenticate the external device based on the key information and the digital signature.

13. The system of claim 12, wherein the target device comprises a one-time-programmable memory coupled with the second processor core, wherein the one-time-programmable memory is provisioned with key information, and wherein the second processor core is configured to authenticate the external device based on a comparison of i) the key information of the one-time-programmable memory and ii) the key information of the credentials.

14. The system of claim 13, wherein the target device comprises a system-on-chip (SoC), and wherein the second processor core is configured to provide, via the debug session, access to one or more SoC registers and one or more SoC peripherals.

15. A method comprising:
operating a first processor core of a target device to provide an application execution environment;
storing, in first memory coupled with the first processor core, programs and data for the application execution environment;
monitoring, from a secure execution environment of a second processor core of the target device separate from the first processor core, the application execution environment of the first processor core;
storing, in second memory separate from the first memory and coupled with the second processor core, firmware for executing the secure execution environment;
operating a communication interface of the target device to provide external communications for the application execution environment and the secure execution environment; and
executing the firmware stored in the second memory using the second processor core to:
detect, within the secure execution environment of the second processor core of the device, an external device connecting to the device, via the communication interface, to start a debug session;
determine whether to allow the debug session based on credentials received, via the communicate interface, from the external device; and
provide, via the debug session, read and write access to the first memory of the device and one or more registers of the first processor core based on the credentials being successfully authenticated.

16. The method of claim 15, comprising:
detecting a crash event associated with the first processor core; and operating the second processor core to take over the communication interface based on a detection of the crash event to enable external connectivity for debugging purposes.

17. The method of claim 15, comprising:
detecting a crash event associated with the first processor core; and
operating the second processor core to generate a crash report based on a detection of the crash event; and
operating the second processor core to provide the crash report via the debug session.

18. The method of claim 15, wherein the communication interface comprises a wireless communication interface, and wherein the method comprises providing the debug session over the wireless communication interface.

19. The method of claim 15, wherein the credentials comprise key information and a digital signature, and wherein determining whether to allow the debug session comprises authenticating the external device based on the key information and the digital signature.

20. The method of claim 19, wherein determining whether to allow the debug session comprises retrieving key information from a one-time-programmable memory coupled with the second processor core, and wherein the authenticating comprises authenticating the external device based on a comparison of i) the key information of the one-time-programmable memory and ii) the key information of the credentials.

* * * * *